US007689400B2

(12) United States Patent
Alley et al.

(10) Patent No.: US 7,689,400 B2
(45) Date of Patent: Mar. 30, 2010

(54) RECONSTRUCTION OF DATA FROM SIMULATION MODELS

(75) Inventors: Charles Lenier Alley, Durham, NC (US); Anthony Joseph Bybell, Carrboro, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/348,035

(22) Filed: Jan. 2, 2009

(65) Prior Publication Data
US 2009/0112556 A1     Apr. 30, 2009

Related U.S. Application Data

(63) Continuation of application No. 11/135,739, filed on May 24, 2005, now Pat. No. 7,526,419.

(51) Int. Cl.
*G06F 17/50* (2006.01)
(52) U.S. Cl. ............... 703/14; 716/1; 716/4; 716/5
(58) Field of Classification Search ............ 703/2, 703/14; 714/33; 716/1, 4, 5; 710/105; 717/108; 700/96; 375/240.01; 84/661
See application file for complete search history.

(56) References Cited

U.S. PATENT DOCUMENTS

| | | | | |
|---|---|---|---|---|
| 6,058,447 | A * | 5/2000 | Holst et al. | 710/105 |
| 6,236,956 | B1 * | 5/2001 | Mantooth et al. | 703/14 |
| 6,279,122 | B1 * | 8/2001 | Hitchcock et al. | 714/33 |
| 6,284,965 | B1 * | 9/2001 | Smith et al. | 84/661 |
| 6,571,373 | B1 * | 5/2003 | Devins et al. | 716/5 |
| 7,020,869 | B2 * | 3/2006 | Abrari et al. | 717/108 |
| 7,219,315 | B1 * | 5/2007 | Stoye et al. | 716/4 |
| 7,243,322 | B1 * | 7/2007 | Ly et al. | 716/5 |
| 2003/0065413 | A1 * | 4/2003 | Liteplo et al. | 700/96 |
| 2003/0112864 | A1 * | 6/2003 | Karczewicz et al. | 375/240.01 |
| 2003/0208721 | A1 * | 11/2003 | Regnier | 716/1 |

OTHER PUBLICATIONS

Marantz, Joshua, "Enhanced Visibility and Performance in Functional Verification By Reconstruction," DAC 1998, San Francisco, CA, pp. 164-169.

* cited by examiner

*Primary Examiner*—Kidest Bahta
*Assistant Examiner*—Kandasamy Thangavelu
(74) *Attorney, Agent, or Firm*—Mark E. McBurney; Schubert Osterrieder & Nickelson PLLC (57) ABSTRACT

Systems, method, and media for reconstructing data from simulation models are disclosed. Embodiments may include a method for accessing an alias from an alias file. The method may generally include searching for a net name and, if the net name is not found, searching an alias index file for an alias index entry associated with the net name, the alias index entry having a net name and an associated position. The method may also generally include, if the net name entry is found, accessing from an alias file an alias associated with the net name. A further embodiment may generally include receiving a net name and a position of an alias in the alias file, creating an alias index entry for the alias having a net name and the position of the alias, and storing the created alias index entry in the alias index file.

17 Claims, 4 Drawing Sheets

RECONSTRUCTION OF DATA FROM SIMULATION MODELS

CROSS-REFERENCES TO RELATED APPLICATION(S)

Pursuant to 35 USC §120, this continuation application claims priority to and benefit of U.S. patent application Ser. No. 11/135,739, entitled "SYSTEMS, METHODS, AND MEDIA FOR RECONSTRUCTING DATA FROM SIMULATION MODELS", filed on May 24, 2005, the disclosures of which are incorporated herein in its entirety for all purposes.

BACKGROUND OF THE INVENTION

The present invention generally relates to the field of simulation of complex systems. More particularly, the present invention relates to systems, methods, and media for reconstructing data from simulation models of Integrated Circuit (IC) chip designs.

Design of an Integrated Circuit (IC) chip, including its architecture, is a very complex, expensive, and time-consuming task, making verification of that design before fabrication important. When designing increasingly complex processors or IC chips such as Application-Specific ICs (ASICs) and system-on-chips (SoC's), functional verification of the design has proven to be a major bottleneck in achieving time-to-market goals. Functional verification ensures functional conformance of an integrated circuit design to its architectural and microarchitectural specifications and determines whether a design is logically correct. The verification process involves developing and simulating tests that are used to determine whether design components (e.g., processor units, resources, functions, etc.) behave according to their functional specification. Verification of the design of a complex system such as an IC chip is an iterative process where the entire system (or at least all of its major features) is tested or simulated on a continuous basis for the duration of the design. As the design complexity increases, so does the state space and the number of functional states and finite state machines that need to be verified. In a typical microprocessor design environment, billions of simulation cycles are required to verify all features of the design.

IC chip designers typically build simulation models such as register-transfer-level (RTL) models to model and simulate the performance of design components. RTL models may be hardware models that have a direct correspondence to gate-level functions of IC chip hardware. Designers typically design RTL models in a hierarchical fashion where one design module encapsulates and instantiates submodules. The building-block approach of a hierarchical design makes it easier to build and test designs. As part of the hierarchical approach to designing RTL models, only a useful subset of the model's functional logic is preserved when the model is created. To reduce the size of the RTL model, logic that is redundant or unnecessary for functional simulation is eliminated in a process that is known as 'flattening' the RTL model. For example, redundant nets that are functionally or electrically equivalent may be eliminated from the RTL model and only the highest-level net be saved. Other control or data signals that are shared across multiple modules may be similarly removed from the RTL model. Similarly, logic made unnecessary by functions such as inversion or concatenation may also be removed from the RTL model. Reduction of the functional logic reduces the size of the RTL model and decreases the resources, such as the memory footprint, necessary to execute the model and perform simulations using the model.

Eliminating unnecessary logic from an RTL model does save on simulation resources, but it makes interfacing and debugging more difficult for human designers. Designers seeking to debug a particular net, for example, must determine if the net exists at the current level of hierarchy and if it does not, they must find out its designation in the model and then work with its actual designation. Such a process can be laborious and time-consuming. To assist with the process, alias files can be created during the model build process. When a model is recursively flattened during a build and equivalent nets are optimized out of the model, the location of the equivalent nets may be written to the alias file. The alias files thus provide a method to reconstruct optimized-out information from a model and to restore accessibility of that information by providing the necessary logic equation information that is not present in the model itself.

For large simulation models such as those for SoC designs, however, the massive size of alias files makes them difficult to work with. For these large simulation models that have many equivalent nets, the size of the alias file may reach hundreds of megabytes or higher, making them practically unmanageable for many purposes. A designer attempting to find information about particular signals stored in the alias file, for example, may have to use search tools such as 'grep' in UNIX to manually search the alias file, a cumbersome process. As alias files become larger and larger because of increased design complexity, the inconvenience of using them to find information also increases.

There is, therefore, a need for an effective and efficient system to access data from simulation models and files. There is an even greater need for such a system as the complexity of designs to be simulated continues to increase.

BRIEF SUMMARY OF THE INVENTION

The problems identified above are in large part addressed by systems and media for reconstructing data from simulation models. One embodiment generally provides a method for accessing an alias from an alias file. The method may generally include searching for a net name and, in the event the net name is not found, searching an alias index file for an alias index entry associated with the net name, where the alias index entry has a net name and an associated position in the alias file. The method may also generally include, in the event the net name entry is found, accessing from an alias file an alias associated with the net name. A further embodiment of the method may generally include receiving a net name and a position of an alias in the alias file, creating an alias index entry for the alias where the alias index entry has a net name and the position of the alias, and storing the created alias index entry in the alias index file.

Another embodiment provides a machine-accessible medium containing instructions that are effective when executed in a data processing system to cause the system to perform a series of operations for accessing an alias from an alias file. The series of operations generally includes searching for a net name and, in the event the net name is not found, searching an alias index file for an alias index entry associated with the net name, where the alias index entry has a net name and an associated position in the alias file. The series of operations may also generally include, in the event the net name entry is found, accessing from an alias file an alias associated with the net name. A further embodiment of the series of operations may generally include receiving a net name and a position of an alias in the alias file, creating an alias index entry for the alias where the alias index entry has a net name and the position of the alias, and storing the created alias index entry in the alias index file.

A further embodiment provides an alias index system. The system may generally include a simulation model generator for generating a simulation model of a design and an alias file in communication with the simulation model generator having a plurality of net names and associated aliases. The system may also include an alias index file generator in communication with the alias file for generating an alias index file based on the alias file, where the alias index file has a plurality of alias index entries each having a net name and an indication of a position of the net name in the alias file.

BRIEF DESCRIPTION OF THE SEVERAL VIEWS OF THE DRAWINGS

Other aspects of certain embodiments of the invention will become apparent upon reading the following detailed description and upon reference to the accompanying drawings in which, like references may indicate similar elements.

DETAILED DESCRIPTION OF THE INVENTION

The following is a detailed description of example embodiments of the invention depicted in the accompanying drawings. The example embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Systems, methods, and media for reconstructing data from simulation models are disclosed. Embodiments may include a method for accessing an alias from an alias file. Embodiments of the method may generally include searching for a net name and, if the net name is not found, searching an alias index file for an alias index entry associated with the net name, the alias index entry having a net name and an associated position. The method may also generally include, if the net name entry is found, accessing from an alias file an alias associated with the net name. A further embodiment of the method may generally include receiving a net name and a position of an alias in the alias file, creating an alias index entry for the alias having a net name and the position of the alias, and storing the created alias index entry in the alias index file.

The disclosed system may provide an improved solution for reconstructing data from a simulation model and its alias file. In previous systems, a user using a simulator or waveform viewer who attempted to access information about a net that had been optimized out of a model and/or dumpfile would have to manually search an alias file for the alias of the removed net, causing an interruption of workflow and a waste of time and resources. Using the disclosed system, a simulator or waveform viewer may advantageously first access and search an alias index file instead of the alias file, reducing the time and resources necessary to acquire the alias as the alias index file may be significantly smaller than the alias file. The disclosed system may also allow for the simulator or waveform viewer to insert the alias into the model (or reconstruct the appropriate waveform data in the case of a waveform viewer) so that future attempts to access the net do not require access of the alias file.

Figure 1:
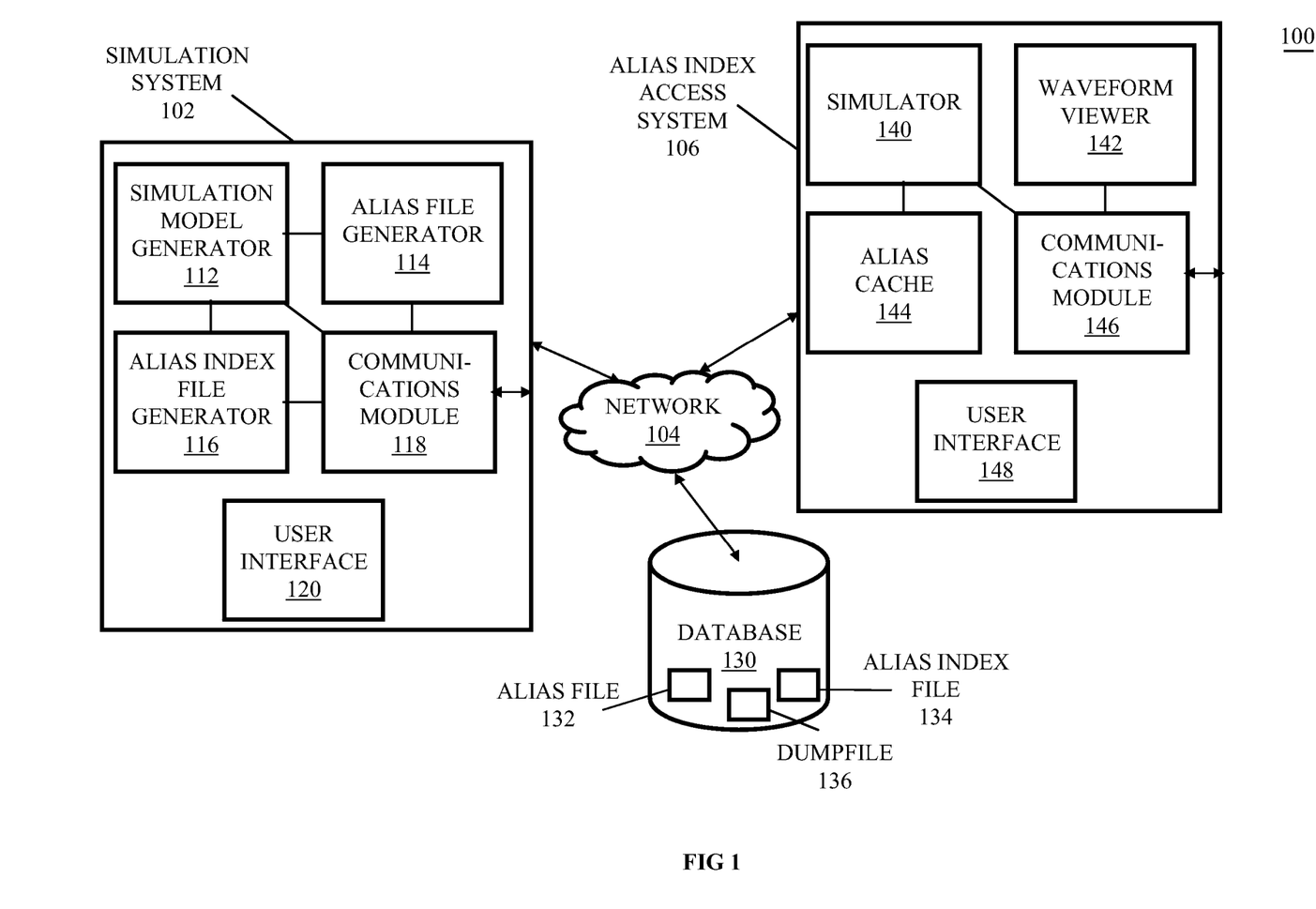
FIG. 1 depicts a schematic view of an alias index system according to one embodiment.

Turning now to the drawings, FIG. 1 depicts a schematic view of an alias index system according to one embodiment. Alias index system 100 may include a simulation system 102 and an alias index access system 106 in communication via a network 104. Alias index system 100 may also include one or more databases 130 which may be in communication with other components via network 104 or may be part of the simulation system 102 or alias index access system 106. The simulation system 102 may generate simulation models, alias files associated with those simulation models, and an alias index file. The alias index access system 106 may access the contents of the generated files using a simulator and/or waveform viewer. As will be described in more detail subsequently, the disclosed alias index system 100 advantageously may allow a user of a simulator and/or waveform viewer to automatically access the contents of an alias file by utilizing an alias index file, which may allow the user from having to manually search for aliases in the potentially very large alias file.

The components of the alias index system 100, such as the simulation system 102 and/or the alias index access system 106 may, in one embodiment, be software implemented on one or more of any type of computer system, including servers, personal computers, workstations, mainframe computers, notebook or laptop computers, desktop computers, or the like. In one example, the simulation system 102 and/or the alias index access system 106 may be implemented on an IBM® eServer or similar server having one or more processors, or threads of processors, executing software and/or one or more state machines coupled with data storage devices such as random access memory (RAM), read only memory (ROM), flash memory, compact disk drives, hard drives, and the like. The components of the alias index system 100 may be in communication with each other by any means. In one embodiment, a network 104 such as the Internet, an intranet, a LAN, a WAN, an Ethernet network, or a wireless network may connect components. In another embodiment, the simulation system 102, the alias index access system 104, and/or database 130, or any of their components, may be part of the same computer system. Those skilled in the art will recognize that the alias index system 100 may utilize any type of data communication channel between components and may be implemented on any type or combination of computer systems without departure from the scope and spirit of the invention.

The simulation system 102 may include a simulation model generator 112, an alias file generator 114, an alias index file generator 116, a communications module 118, and a user interface 120. The simulation model generator 112 may generate an RTL simulation model suitable to simulate the design functionality of an IC chip and its components. The simulation model generator 112 may in one embodiment use a hierarchical approach to designing RTL models where only a useful subset of the model's functional logic is preserved when the model is created. In this embodiment, the simulation model generator 112 may eliminate logic that is redundant or unnecessary for functional simulation by 'flattening' the RTL model to reduce the size of the model. For example, the simulation model generator 112 may eliminate redundant nets that are functionally or electrically equivalent from the RTL model and only save the highest-level net. The simulation model generator 112 may also remove other control or data signals that are shared across multiple modules, such as logic made unnecessary by functions such as inversion or concatenation. Reduction of the functional logic reduces the size of the RTL model and decreases the resources, such as the memory footprint, necessary to execute the model and perform simulations using the model.

Designers may typically design RTL models in a hierarchical fashion where one design module encapsulates and instantiates submodules. By adopting such a building-block approach, a simulation model generator 112 may make it easier to build and test designs, similarly to how classes work in object-oriented programming languages such as C++. RTL models often have control and data signals, such as clocks, that may be shared across numerous modules. For example, modules and submodules of a design may include 'Top', 'Top.A', 'Top.A.B', 'Top.A.C', 'Top.A.C.D', 'Top.E', and so on, where 'A' and 'E' are submodules of 'Top', 'B' and 'C' are submodules of 'A', and 'D' is a submodule of 'C'. If a single clock net is shared across multiple modules and submodules, a simulator would have to keep track of a different net for each when just one will suffice, as they are functionally equivalent. The simulation model generator 112 may therefore flatten the model by eliminating the lower level nets and only keeping the highest level net, which will reduce the number of nets (and accordingly reduce the file size and resources required to simulate) without impacting the functionality of the model. In previous systems, the flattening of the model made it difficult and cumbersome to troubleshoot a net as they would have to determine if a net exists at the current level of hierarchy and, if not, manually search the alias file to find the net's designation in the model in order to work the actual designation of the net.

The alias file generator 114, which may alternatively be part of the simulation model generator 112, may generate an alias file when the simulation model generator 112 recursively flattens the simulation model during a build and optimizes equivalent nets out of the model, as described previously. The alias file may contain the location of the equivalent nets that were optimized out of the model, providing users a method to reconstruct optimized-out information from a model and to restore accessibility of that information. An example alias file (based on the previous example of a module and submodules) with entries for a 'clock' signal may include entries for 'Top.A.clock=Top.clock', 'Top.A.B.clock=Top.clock', 'Top.A.C.clock=Top.clock', 'Top.A.C.D.clock=Top.clock', 'Top.E.clock=Top.clock', and so on. In this example, each entry includes a net name and an alias associated with that net name. The 'Top.A.clock' net name, for example, has an alias of 'Top.clock', and so on. In another example, the alias associated with a net name may include an expression instead of a reference, such as an inversion or concatenation of different net names. As the model created by the simulation model generator 112 that has been flattened does not include the lower level hierarchy nets, the alias file created by the alias file generator 114 may provide the necessary logic equation information that is not present in the model itself to extract information about those signals. The alias file generator 114 may include one-for-one aliasing as described herein or may use any other methodology to associate net names with an alias.

A net name may be the name of a net or wires that connect nodes of a design such as instances, primitives, or pins. Instances may be modules of a design that may be expanded into lower hierarchy levels. Primitives may be lower-level nodes that cannot be expanded to any lower hierarchy levels. Pins may be I/O ports in a level of the hierarchy.

The alias index file generator 116 may create an alias index file based on the contents of an alias file. For each entry in the alias file, the alias index file generator 116 may record an alias index entry having a net name and an indication of a position within the alias file. In a further embodiment, the alias index file generator 116 may also record a record length with each net name. The index search key may be the net name in one embodiment. The alias index file generator 116 may use any methodology to store net names and locations in the alias index file, including search structures such as a lexically-sorted prefix compressed list, hierarchical name trees, or a hashed key database.

The alias index file generator 116 may, in one embodiment, create the alias index file while the alias file generator 114 is generating the alias file. In this embodiment, the alias file generator 114 and alias index file generator 116 may be combined into one module. Creating the alias index file simultaneously with the alias file may be a particularly efficient method for creating the alias index file but it may require modification of the alias file generator 114 code. Alternatively, the alias index file generator 116 may generate the alias index file by analyzing an existing alias file that has already been created. In this embodiment, a user need not have access to the alias file generator 114 code but may be able to create an alias index file from any alias file. The alias index file generator 116 may optionally be located in the alias index access system 106 in this embodiment.

The communications module 118 of the simulation system 102 may facilitate transmission and receipt of information to and from the simulation system 102, such as via network 104. The user interface 120 may receive input from users and provide output to users to and from the simulation system 102. The user interface 120 may utilize any mechanisms or methodologies for receiving input (e.g., keyboard, mouse, user interface, voice command, etc.) or providing output (e.g., display, audio output, printouts, etc.).

The alias index access system 106 may include a simulator 140, a waveform viewer 142, an alias cache 144, a communications module 146, and a user interface 148. The simulator 140 and/or waveform viewer 142 may allow a user to access either a simulation model or a dumpfile from an executed simulation, respectively. A user may use the simulator 140 analyze a model created by the simulation model generator 112, such as by analyzing particular nets of the model. A user may use the waveform viewer 142 as a visualization tool to analyze the results of a simulation by reviewing the contents of a dumpfile. In previous systems, a user who desired to find out more information about a particular net that had been 'flattened-out' of a model would have had to manually search the alias file for that model for an alias for that net so that they could properly analyze the net, a laborious and time-consuming process. Using the disclosed system (and as described in more detail in relation to FIGS. 3 and 4), the simulator 140 and/or waveform viewer 142 may advantageously automatically access an alias index file to determine the alias of a net name, potentially saving significant time and resources.

The optional alias cache 144 may provide an additional level of efficiency to the simulator's 140 access of an alias index file. The alias cache 144 may contain any aliases fetched by the simulator 140 during previous times the simulator 140 has run so that attempts to access the same aliases are even quicker in subsequent efforts. The alias cache 144 may, in effect, create an additional layer of aliases likely to be used again so that the simulator need not access the alias index file itself for items in the alias cache 144.

The communications module 146 of the alias index access system 106 may facilitate transmission and receipt of information to and from the alias index access system 106, such as via network 104. The user interface 148 may receive input from users and provide output to users to and from the alias index access system 106, similarly to the user interface 120 of the simulation system 102.

Database 130 may include an alias file 132, an alias index file 134, and/or a dumpfile 136, or any other type of information, for use by other components of the alias index system 100. Database 130 may utilize any type of volatile or non-volatile memory to store files. Database 130 may include multiple databases containing different information and may optionally be included, in whole or in part, as part of the simulation system 102 and/or alias index access system 106.

Figure 2:
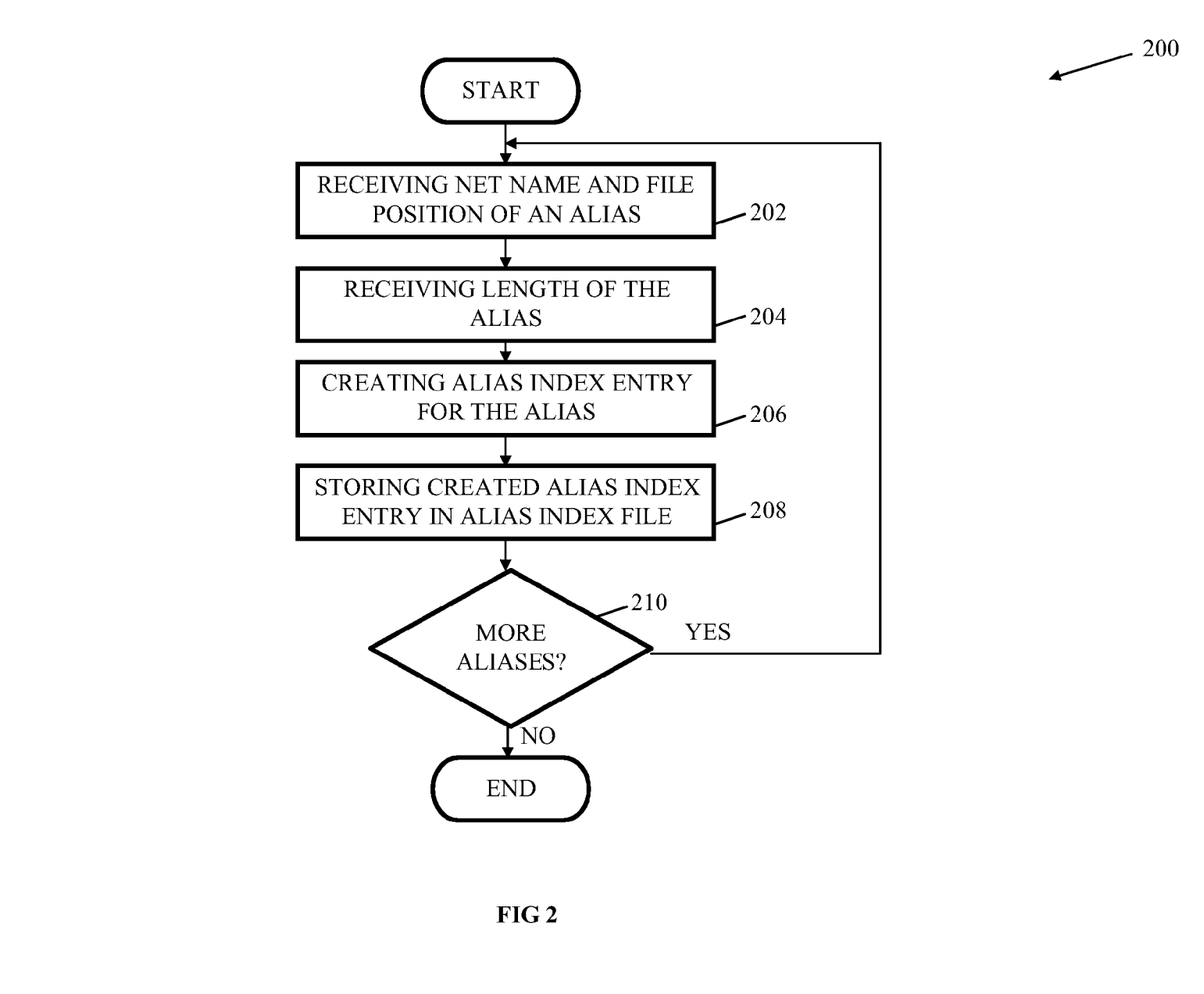
FIG. 2 depicts an example of a flow chart depicting the creation of an alias index file according to one embodiment.

FIG. 2 depicts an example of a flow chart depicting the creation of an alias index file according to one embodiment. Components or combinations of components of the simulation system 102 may perform the elements of flow chart 200 in one embodiment. Flow chart 200 begins with element 202, where the alias index file generator 116 may receive the net name and file position of an alias. In one embodiment, the alias index file generator 116 may receive the net name and file position of an alias from an alias file generator 114, such as when the alias index file generator 116 is generating an alias index file simultaneously with the creation of the alias file. In another embodiment, the alias index file generator 116 may receive the net name and file position of an alias by accessing an alias file 132 itself.

The alias index file generator 116 may optionally receive the length of the alias at element 204. In this embodiment, the alias index file generator 116 may have a data triple (with name, position, and length) instead of a duple (with name and position). The alias index file generator 116 may use the length information to help locate alias information within the alias file 132. The alias index file generator 116 may alternatively use any well-defined method for determining where a record in the alias file 132 ends, such as knowing the length of records (instead of receiving that information) or accessing a marker in the file that provides an indication of the end of a record.

The method of flow chart 200 may continue to element 206, where the alias index file generator 116 may create an alias index entry for a particular alias. Depending on whether the length of the alias will be stored, the alias index file generator 116 may create the alias index entry as either a duple or triple. After creating the alias index entry, the alias index file generator 116 may store the created alias index entry in an alias index file 134 at element 208. As described previously, the alias index file generator 116 may store alias index entries in the alias index file 134 in any fashion. If the alias index file generator 116 determines at decision block 210 that more aliases need be processed, the method of flow chart 200 may return to element 202 for further processing. If alias index file generator 116 has completed all aliases, the method of flow chart 200 may terminate.

Figure 3:
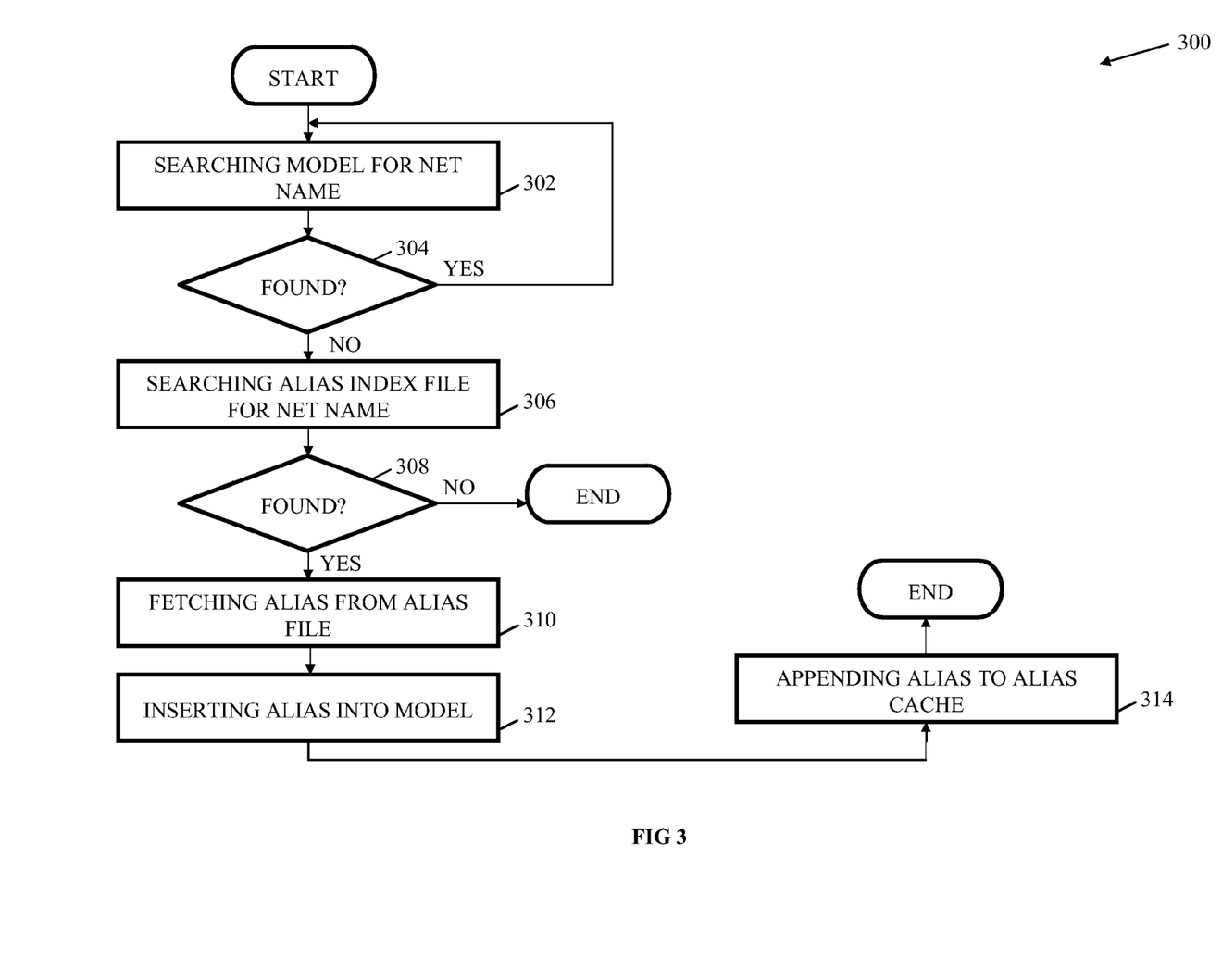
FIG. 3 depicts an example of a flow chart depicting using an alias index file with a simulator according to one embodiment.

FIG. 3 depicts an example of a flow chart depicting using an alias index file with a simulator according to one embodiment. Components or combinations of components of the alias index access system 106 may perform the elements of flow chart 300 in one embodiment. Flow chart 300 begins with element 302, where the simulator 140 may search a model for a particular net name, such as when a user of the simulator 140 desires to analyze or otherwise find out information about how a net is handled in the model. In one example, an engineer who wrote a checker for a PCI bus in a design may want to look inside the model to trace operations going through the chip simulation. If the simulator 140 finds the net name in the model at decision block 304, it may continue processing by returning to element 302. If the simulator 140 does not find the net name at decision block 304, the attempt to access the net name by the simulator 140 is trapped and the method of flow chart 300 continues to element 306. The absence of a net name may indicate that the missing net name that the PCI bus checker wishes to access may have been optimized out of the model. In previous systems, the engineer would have to exit the simulation and manually look at the alias file 132 to determine the alias for the net name. As will be described subsequently, the disclosed methodology allows the simulator 140 to automatically access the alias for a net name and, from the point of view of the engineer or other user, provides a seamless integration that lets the simulator 140 operate as though the RTL model had never been optimized.

Once the simulator 140 determines that the net name it is searching for is not in the model, the simulator 140 may search the alias index file 134 for the net name using any type of search or database methodology. In an alternative embodiment, the simulator may first search an alias cache 144 before searching the alias index file 134 itself. If the simulator 140 does not find the net name in the alias index file 134 at decision block 308, the method of flow chart 300 terminates and the access operation will fail. If the simulator 140 does find the net name at decision block 308, the method of flow chart 300 may continue to element 310.

After the simulator 140 finds the alias in the alias index file 134, the simulator 140 may access the alias by fetching it from the alias file 132 at element 310 using the information regarding the alias name and location (and optionally the length) from the alias index file 134. After fetching the alias, the simulator 140 may insert the alias into the model at element 312 so that future references to that net name succeed and perform as intended. For example, the simulator 140 may insert the original net name or expression from the alias file 132 into the model.

At element 314, the simulator 140 may optionally append the alias to an alias cache 144, after which the method of flow chart 314 terminates. This alternative embodiment provides for adding aliases to the alias cache 144 that will be accessed before the alias index file 134 itself. This embodiment may be useful in a situation where the alias index file 134 becomes large enough to cause performance slowdowns on its own. Having an alias in the alias cache 144 makes it unnecessary for the simulator 140 to search for that alias in the alias index file 134.

Figure 4:
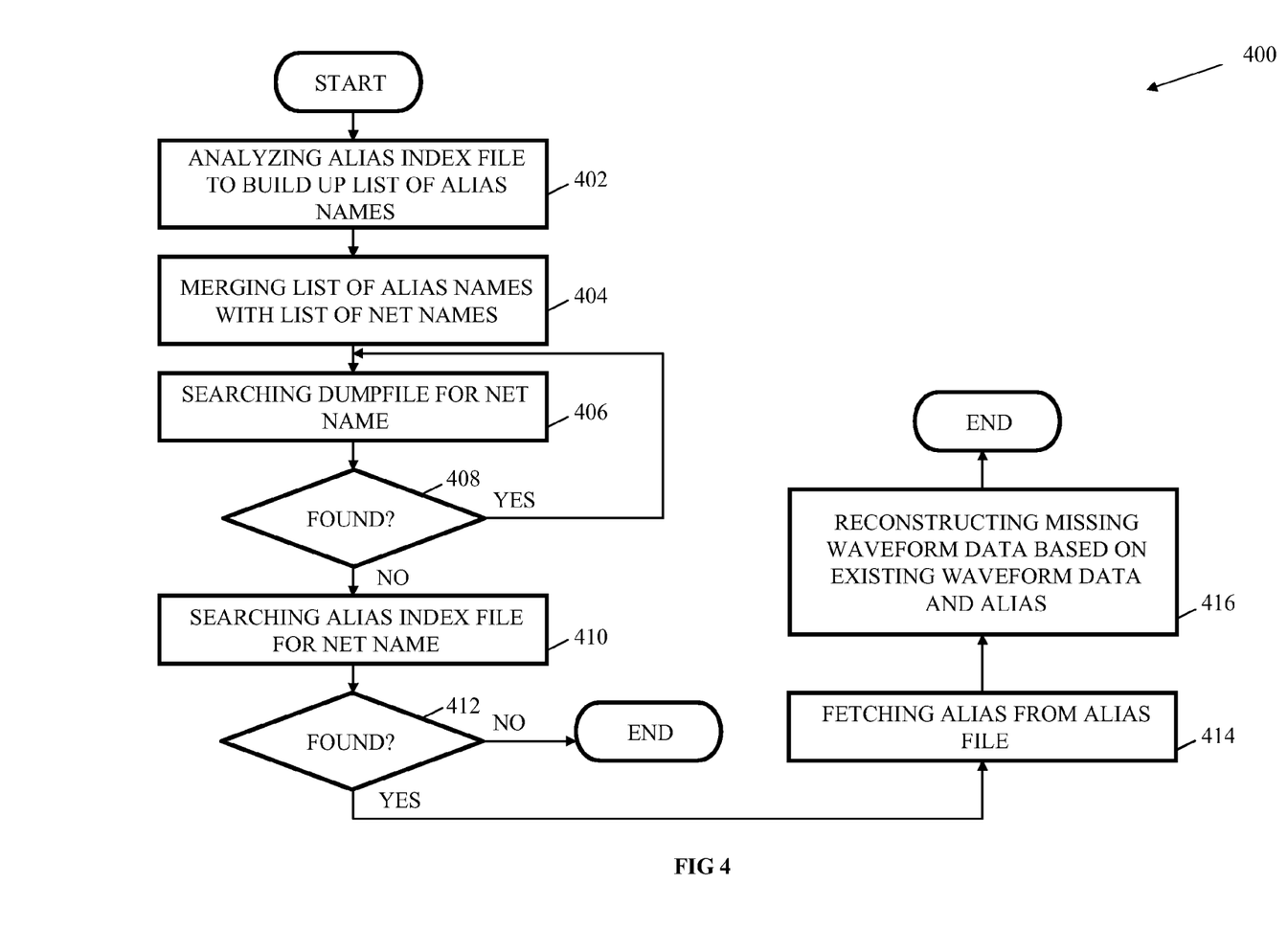
FIG. 4 depicts an example of a flow chart depicting using an alias index file with a waveform viewer according to one embodiment.

FIG. 4 depicts an example of a flow chart depicting using an alias index file with a waveform viewer according to one embodiment. Components or combinations of components of the alias index access system 106 may perform the elements of flow chart 400 in one embodiment. Flow chart 400 begins with element 402, where the waveform viewer 142 may analyze the alias index file 134 to build up a list of all of the alias names that exist in the model (i.e., the index keys). The waveform viewer 142 may then merge the list of alias names with a list of net names which do exist in the model at element 404 and may thus be found in the dumpfile 136. Element 404 is optional but may provide increased speed of operations such as regular expression searches over the complete list of nets in the dumpfile 136.

User interaction with the waveform viewer 142 continues at element 406, where the waveform viewer 142 may search a dumpfile 136 for a particular net name, such as when a user of the waveform viewer 142 desires to analyze or otherwise find out information about how a net is handled in the simulation. If the waveform viewer 142 finds the net name in the dumpfile 136 (or the generated list from element 402) at decision block 408, it may continue processing by returning to element 406. If the waveform viewer 142 does not find the net name at decision block 408, the attempt to access the net name by the waveform viewer 142 is trapped and the method of flow chart 400 continues to element 410. The absence of a net name may indicate that the net has been optimized out of the model. In previous systems, the engineer would have to exit the waveform viewer 142 and manually look at the alias file 132 to determine the alias for the net name. As will be described subsequently, the disclosed methodology allows the waveform viewer 142 to automatically access the alias for a net name and, from the point of view of the engineer or other user, provides a seamless integration that lets the waveform viewer 142 operate as though the RTL model had never been optimized.

Once the waveform viewer 142 determines that the net name it is searching for is not in the dumpfile 136, the waveform viewer 142 may search the alias index file 134 for the net name using any type of search or database methodology. If the waveform viewer 142 does not find the net name in the alias index file 134 at decision block 412, the method of flow chart 400 terminates and the access operation will fail. If the waveform viewer 142 does find the net name at decision block 412, the method of flow chart 400 may continue to element 414.

After the waveform viewer 142 finds the alias in the alias index file 134, the waveform viewer 142 may access the alias by fetching it from the alias file 132 at element 414 using the information regarding the alias name and location (and optionally the length) from the alias index file 134. After fetching the alias, the waveform viewer 142 may reconstruct the missing waveform data based on the existing waveform data in the dumpfile 136 and the alias at element 416. After the waveform viewer 142 has reconstructed the missing waveform data, the waveform viewer 142 may treat the dumpfile 136 as if the missing waveform data had already existing. This may advantageously allow a user of the waveform viewer 142 to access waveform data associated with missing nets seamlessly, potentially saving significant amounts of time. In one embodiment, the waveform viewer 142 at element 416 may query the appropriate real (i.e., existing) nets in the dumpfile 136 and for each timestep that exists for the real nets in the dumpfile 136, the waveform viewer 142 may simulate the real nets over the real net data. The waveform viewer 142 may then treat the created data as if it came from the dumpfile 136. As waveform viewers 142 typically query a dumpfile 136 once over a range of time for a given net, the waveform viewer 142 may only need to recreate the alias data for a net once. After the missing waveform data is reconstructed, the method of flow chart 400 may then terminate.

Each software program described herein may be operated on any type of computer, such as a personal computer, server, etc. Any program may be contained on a variety of signal-bearing media. Illustrative signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment specifically includes information downloaded from the Internet, intranet or other networks. Such signal-bearing media, when carrying computer-readable instructions that direct the functions of the present invention, represent embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

It will be apparent to those skilled in the art having the benefit of this disclosure that the present invention contemplates systems, methods, and media accessing an alias from an alias file. It is understood that the form of the invention shown and described in the detailed description and the drawings are to be taken merely as examples. It is intended that the following claims be interpreted broadly to embrace all the variations of the example embodiments disclosed.

What is claimed is:

1. A computer-implemented method executing on one or more processors of a computer system for accessing an alias from an alias file, the method comprising:
   generating by an alias file generator an alias file for the simulation model containing locations for the equivalent nets that were optimized out of a flattened simulation model;
   generating by an alias index file generator an alias index file for the generated alias file, the alias index file having a plurality of entries having a net name, a record length, and an associated position in the alias file for each net name in the generated alias file;
   searching by a simulator a simulation model for a particular net name;
   in response to failing to find the particular net name in the model, automatically searching by an alias index access system an alias cache for the particular net name to attempt to determine an alias for the particular net name;
   in response to failing to find the particular net name in the alias cache, automatically searching by the alias index access system the generated alias index file for an alias index entry associated with the net name;
   in the event the net name entry is found, accessing by the alias index access system from an alias file an alias associated with the net name; and
   fetching by the alias index access system the alias associated with the net name from the alias file.

2. The method of claim 1, further comprising inserting by the alias index access system the fetched alias into the flattened simulation model.

3. The method of claim 1, wherein generating by the alias index file generator an alias index file comprises, simultaneously with generating the alias file, generating by the alias index file generator the alias index file for the generated alias file by, for each entry of the alias file, receiving a net name, record length, and a position of an alias in the alias file, creating an alias index entry for the alias, and storing the created alias index entry.

4. The method of claim 1, further comprising by a simulation model generator, flattening a simulation model during a build and optimizing equivalent nets out of the simulation model.

5. The method of claim 1, further comprising:
before searching by the alias index access system for the net name, analyzing the alias index file to build a list of alias names; and
merging the list of alias names with a list of net names from a dumpfile.

6. The method of claim 1, further comprising appending by the alias index access system the alias to an alias cache.

7. A storage device having a machine-accessible medium containing instructions effective, when executing in a data processing system, to cause said data processing system to perform operations for accessing an alias from an alias file comprising:
generating by an alias file generator an alias file for the simulation model containing locations for the equivalent nets that were optimized out of a flattened simulation model;
generating by an alias index file generator an alias index file for the generated alias file, the alias index file having a plurality of entries having a net name, a record length, and an associated position in the alias file for each net name in the generated alias file;
searching by a simulator a simulation model for a particular net name;
in response to failing to find the particular net name in the model, automatically searching by an alias index access system an alias cache for the particular net name to attempt to determine an alias for the particular net name;
in response to failing to find the particular net name in the alias cache, automatically searching by the alias index access system the generated alias index file for an alias index entry associated with the net name;
in the event the net name entry is found, accessing by the alias index access system from an alias file an alias associated with the net name; and
fetching by the alias index access system the alias associated with the net name from the alias file.

8. The machine-accessible medium of claim 7, further comprising instructions for inserting by the alias index access system the fetched alias into the flattened simulation model.

9. The machine-accessible medium of claim 7, wherein generating by the alias index file generator an alias index file comprises, simultaneously with generating the alias file, generating by the alias index file generator the alias index file for the generated alias file by, for each entry of the alias file, receiving a net name, record length, and a position of an alias in the alias file, creating an alias index entry for the alias, and storing the created alias index entry.

10. The machine-accessible medium of claim 7, further comprising instructions for, by a simulation model generator, flattening a simulation model during a build and optimizing equivalent nets out of the simulation model.

11. The machine-accessible medium of claim 7, further comprising instructions for:
before searching by the alias index access system for the net name, analyzing the alias index file to build a list of alias names; and
merging the list of alias names with a list of net names from a dumpfile.

12. The machine-accessible medium of claim 7, further comprising instructions for appending by the alias index access system the alias to an alias cache.

13. An alias index system implemented on a computer system, the alias index system comprising:
an alias file generator to generate an alias file for the simulation model containing locations for any equivalent nets that were optimized out of a simulation model;
an alias file in communication with the simulation model generator and having a plurality of net names and associated aliases;
an alias index file generator in communication with the alias file to generate an alias index file based on the alias file, the alias index file having a plurality of alias index entries each having a net name, a record length, and an indication of a position of the net name in the alias file;
wherein the alias index file generator generates alias index files by, for each entry of the alias file, receiving a net name, record length, and a position of an alias in the alias file, creating an alias index entry for the alias, and storing the created alias index entry;
a simulator for searching a simulation model for a particular net name; and
an alias index access system to automatically search, in response to the simulator failing to find the particular net name in the model, an alias cache for the particular net name to attempt to determine an alias for the particular net name and, in response to failing to find the particular net name in the alias cache, automatically searching by the alias index access system the generated alias index file for an alias index entry associated with the net name, the alias index entry having a net name, a record length, and an associated position in the alias file.

14. The alias index system of claim 13, further comprising a simulation model generator to generate a simulation model of a design by flattening a simulation model during a build and optimizing equivalent nets out of the simulation model.

15. The alias index system of claim 13, wherein the simulator accesses an alias associated with the net name from the alias file based on the alias index file.

16. The alias index system of claim 13, further comprising a waveform viewer in communication with the alias file and the alias index file, the waveform viewer being adapted to search the alias index file for a net name and to access an alias associated with the net name from the alias file based on the alias index file.

17. The alias index system of claim 13, wherein the plurality of alias index entries each have a length associated with the net name.

* * * * *